(12) United States Patent
Li

(10) Patent No.: US 10,256,243 B2
(45) Date of Patent: Apr. 9, 2019

(54) SEMICONDUCTOR STRUCTURE, STATIC RANDOM ACCESS MEMORY, AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Yong Li, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/824,830

(22) Filed: Nov. 28, 2017

(65) Prior Publication Data
US 2018/0151574 A1    May 31, 2018

(30) Foreign Application Priority Data

Nov. 29, 2016   (CN) .......................... 2016 1 1072328

(51) Int. Cl.
*H01L 27/11* (2006.01)
*H01L 29/66* (2006.01)
(Continued)

(52) U.S. Cl.
CPC .. *H01L 27/1104* (2013.01); *H01L 21/823418* (2013.01); *H01L 21/823814* (2013.01);
(Continued)

(58) Field of Classification Search
CPC ............ H01L 27/1104; H01L 27/0883; H01L 27/0886; H01L 27/0924; H01L 27/0922;
(Continued)

(56) References Cited

U.S. PATENT DOCUMENTS 9,324,623 B1 *  4/2016  Kim ................ H01L 21/823814
9,601,497 B1 *  3/2017  Chen .................... H01L 27/1104
(Continued)

OTHER PUBLICATIONS

The European Patent Office (EPO) The Extended European Search Report for 17203763.2 dated Apr. 23, 2018 8 Pages.

*Primary Examiner* — Sophia Nguyen
(74) *Attorney, Agent, or Firm* — Anova Law Group, PLLC

(57) ABSTRACT

A semiconductor structure, a method for fabricating the semiconductor structure and a static random access memory are provided. The method includes providing a base substrate including a substrate and a plurality of discrete fins on the substrate. The substrate includes a pull-up transistor region and a pull-down transistor region. The method also includes forming a gate structure on each fin; and forming pull-up doped epitaxial layers, in the fin on both sides of the gate structure in the pull-up transistor region. In addition, the method includes forming a first pull-down doped region connected to an adjacent pull-up doped epitaxial layer in the fin on one side of the gate structure in the pull-down transistor region. Further, the method includes forming a second pull-down doped region by performing an ion-doped non-epitaxial layer process on the fin on another side of the gate structure in the pull-down transistor region.

19 Claims, 11 Drawing Sheets

US 10,256,243 B2

Page 2

(51) Int. Cl.
*H01L 21/8238* (2006.01)
*H01L 29/417* (2006.01)
*H01L 27/092* (2006.01)
*H01L 21/8234* (2006.01)
*H01L 29/06* (2006.01)
*H01L 29/78* (2006.01)
*H01L 27/088* (2006.01)
*H01L 21/8236* (2006.01)
*H01L 29/161* (2006.01)
*H01L 29/165* (2006.01)

(52) U.S. Cl.
CPC ............ *H01L 21/823821* (2013.01); *H01L 21/823878* (2013.01); *H01L 27/0886* (2013.01); *H01L 27/0922* (2013.01); *H01L 27/0924* (2013.01); *H01L 29/0684* (2013.01); *H01L 29/41766* (2013.01); *H01L 29/41791* (2013.01); *H01L 29/66636* (2013.01); *H01L 29/66795* (2013.01); *H01L 29/66803* (2013.01); *H01L 29/785* (2013.01); *H01L 29/7831* (2013.01); *H01L 29/7835* (2013.01); *H01L 29/7848* (2013.01); *H01L 29/7851* (2013.01); *H01L 29/7855* (2013.01); *H01L 21/8236* (2013.01); *H01L 27/0883* (2013.01); *H01L 27/0928* (2013.01); *H01L 29/161* (2013.01); *H01L 29/165* (2013.01); *H01L 29/66659* (2013.01); *H01L 2029/7858* (2013.01); *H01L 2924/1437* (2013.01)

(58) Field of Classification Search
CPC ............ H01L 27/0928; H01L 29/7855; H01L 29/7831; H01L 29/41791; H01L 29/7848; H01L 29/41766; H01L 29/66636; H01L 29/66659; H01L 29/66803; H01L 29/7835; H01L 2924/1437; H01L 21/823821; H01L 21/823814; H01L 21/823418; H01L 21/823425
See application file for complete search history.

(56) References Cited

U.S. PATENT DOCUMENTS

| | | | | |
|---|---|---|---|---|
| 9,640,540 B1* | 5/2017 | Liaw | ............... | H01L 27/1104 |
| 2007/0238273 A1* | 10/2007 | Doyle | ............... | H01L 21/26586 |
| | | | | 438/525 |
| 2009/0236633 A1* | 9/2009 | Chuang | ............... | H01L 27/11 |
| | | | | 257/190 |
| 2010/0006945 A1* | 1/2010 | Merelle | ............... | H01L 21/823418 |
| | | | | 257/368 |
| 2011/0068407 A1* | 3/2011 | Yeh | ............... | H01L 21/823807 |
| | | | | 257/369 |
| 2011/0171795 A1* | 7/2011 | Tsai | ............... | H01L 21/26513 |
| | | | | 438/232 |
| 2012/0001197 A1* | 1/2012 | Liaw | ............... | H01L 27/11 |
| | | | | 257/77 |
| 2012/0056245 A1* | 3/2012 | Kang | ............... | H01L 21/0245 |
| | | | | 257/192 |
| 2012/0329220 A1* | 12/2012 | van Bentum | ... | H01L 21/823814 |
| | | | | 438/232 |
| 2013/0032883 A1* | 2/2013 | Chan | ............... | H01L 21/2254 |
| | | | | 257/365 |
| 2013/0049115 A1* | 2/2013 | Cheng | ............... | H01L 29/66803 |
| | | | | 257/347 |
| 2013/0105896 A1* | 5/2013 | Brodsky | ............... | H01L 29/66803 |
| | | | | 257/347 |
| 2013/0181297 A1* | 7/2013 | Liaw | ............... | G11C 11/412 |
| | | | | 257/390 |
| 2013/0214357 A1* | 8/2013 | Chang | ............... | H01L 29/66545 |
| | | | | 257/347 |
| 2013/0258759 A1* | 10/2013 | Liaw | ............... | G11C 11/412 |
| | | | | 365/154 |
| 2014/0203370 A1* | 7/2014 | Maeda | ............... | H01L 29/785 |
| | | | | 257/365 |
| 2015/0041855 A1* | 2/2015 | Liao | ............... | H01L 29/41791 |
| | | | | 257/192 |
| 2015/0091097 A1* | 4/2015 | Wu | ............... | H01L 27/1104 |
| | | | | 257/392 |
| 2015/0333061 A1 | 11/2015 | Kim et al. | | |
| 2015/0349094 A1* | 12/2015 | Song | ............... | H01L 29/66803 |
| | | | | 438/229 |
| 2016/0013316 A1* | 1/2016 | Kuang | ............... | H01L 21/0243 |
| | | | | 257/190 |
| 2016/0027499 A1* | 1/2016 | Liaw | ............... | G11C 11/412 |
| | | | | 365/154 |
| 2016/0064387 A1* | 3/2016 | Jeong | ............... | H01L 27/1104 |
| | | | | 257/401 |
| 2016/0079367 A1 | 3/2016 | Yoo et al. | | |
| 2016/0093730 A1* | 3/2016 | Li | ............... | H01L 29/66545 |
| | | | | 257/335 |
| 2016/0358925 A1* | 12/2016 | Bai | ............... | H01L 27/1104 |
| 2017/0117411 A1* | 4/2017 | Kim | ............... | H01L 27/1104 |
| 2017/0133386 A1* | 5/2017 | Lee | ............... | H01L 21/823807 |
| 2017/0186654 A1* | 6/2017 | Li | ............... | H01L 21/823814 |
| 2017/0207126 A1* | 7/2017 | Ching | ............... | H01L 21/823431 |
| 2017/0221907 A1* | 8/2017 | Hsieh | ............... | H01L 27/0886 |
| 2017/0323888 A1* | 11/2017 | Li | ............... | H01L 29/66795 |
| 2017/0345825 A1* | 11/2017 | Park | ............... | H01L 29/0653 |
| 2017/0345911 A1* | 11/2017 | Yu | ............... | H01L 21/823418 |
| 2017/0352595 A1* | 12/2017 | Li | ............... | H05K 999/99 |
| 2018/0006039 A1* | 1/2018 | Lee | ............... | H01L 29/0847 |
| 2018/0102293 A1* | 4/2018 | Jeong | ............... | H01L 21/823814 |
| 2018/0102363 A1* | 4/2018 | Li | ............... | H01L 27/0886 |
| 2018/0108574 A1* | 4/2018 | Li | ............... | H01L 21/823814 |
| 2018/0151439 A1* | 5/2018 | Huang | ............... | H01L 21/823418 |
| 2018/0151564 A1* | 5/2018 | Lee | ............... | H01L 21/823481 |
| 2018/0151571 A1* | 5/2018 | Zhou | ............... | H01L 27/1104 |
| 2018/0151572 A1* | 5/2018 | Li | ............... | G11C 11/4023 |
| 2018/0151574 A1* | 5/2018 | Li | ............... | H01L 27/1104 |
| 2018/0166573 A1* | 6/2018 | Li | ............... | H01L 29/0847 |

* cited by examiner

SEMICONDUCTOR STRUCTURE, STATIC RANDOM ACCESS MEMORY, AND FABRICATION METHOD THEREOF

CROSS-REFERENCES TO RELATED APPLICATIONS

This application claims the priority of Chinese patent application No. 201611072328.X, filed on Nov. 29, 2016, the entirety of which is incorporated herein by reference.

FIELD OF THE DISCLOSURE

The present disclosure generally relates to the field of semiconductor technology and, more particularly, relates to a semiconductor structure, static random access memory and fabrication method thereof.

BACKGROUND

In the semiconductor manufacturing process, with the development trend of ultra-large scale integrated circuits, feature dimensions of the integrated circuits continues to decrease. To accommodate the reduction of the feature dimensions, a channel length of a metal-oxide-semiconductor field effect transistor (MOSFET) decreases. However, as the channel length of the device decreases, a distance between a source and a drain of the device decreases. Therefore, control ability of a gate to the channel is degraded, and it is more and more difficult to pinch off the channel by the gate voltage. As a result, a subthreshold leakage phenomenon, also known as a short-channel effect (SCE), is more likely to occur.

Therefore, to better accommodate the reduction of the feature dimensions, the semiconductor process gradually began to transit from the planar transistor to a three-dimensional transistor having higher efficiency, such as a fin field effect transistor (FinFET). In the FinFET, the gate can control the ultrathin body (fin) from at least two sides. Thus, the FinFET has a much stronger gate-to-channel control ability than the planar MOSFET device, and can well suppress the short-channel effect. Compared to other devices, the FinFET has better compatibility with existing integrated circuit fabrication techniques.

However, the electrical performance of the conventional FinFET needs to be improved. The disclosed device structures and methods are directed to solve one or more problems set forth above and other problems.

BRIEF SUMMARY OF THE DISCLOSURE

One aspect of the present disclosure includes a method for fabricating a semiconductor structure. The method includes providing a base substrate including a substrate and a plurality of discrete fins on the substrate. The substrate includes a pull-up transistor region and a pull-down transistor region adjacent to the pull-up transistor region. The method also includes forming a gate structure, across a length portion of each fin, covering top and sidewall surfaces of each fin, and on each fin; and forming pull-up doped epitaxial layers, in the fin on both sides of the gate structure in the pull-up transistor region. In addition, the method includes forming a first pull-down doped region, in the fin on one side of the gate structure in the pull-down transistor region. The first pull-down doped region is connected to an adjacent pull-up doped epitaxial layer. Further, the method includes forming a second pull-down doped region, in the fin on another side of the gate structure in the pull-down transistor region. The second pull-down doped region is formed by performing an ion-doped non-epitaxial layer process on the fin.

Another aspect of the present disclosure includes a semiconductor structure. The semiconductor structure includes a base substrate including a substrate and a plurality of discrete fins on the substrate. The substrate includes a pull-up transistor region and a pull-down transistor region adjacent to the pull-up transistor region. The semiconductor structure also includes a gate structure across a length portion of each fin, covering top and sidewall surfaces of each fin, and on each fin; and pull-up doped epitaxial layers in the fin on both sides of the gate structure in the pull-up transistor region. In addition, the semiconductor structure includes a first pull-down doped region in the fin on one side of the gate structure in the pull-down transistor region. The first pull-down doped region is connected to an adjacent pull-up doped epitaxial layer. Further, the semiconductor structure includes a second pull-down doped region, in the fin on the another side of the gate structure in the pull-down transistor region. The second pull-down doped region is a non-epitaxial layer doped region.

Another aspect of the present disclosure includes a static random access memory. The static random access memory includes a semiconductor structure. The semiconductor structure includes a base substrate including a substrate and a plurality of discrete fins on the substrate. The substrate includes a pull-up transistor region and a pull-down transistor region adjacent to the pull-up transistor region. The semiconductor structure also includes a gate structure across a length portion of each fin, covering top and sidewall surfaces of each fin, and on each fin; and pull-up doped epitaxial layers in the fin on both sides of the gate structure in the pull-up transistor region. In addition, the semiconductor structure includes a first pull-down doped region in the fin on one side of the gate structure in the pull-down transistor region. The first pull-down doped region is connected to an adjacent pull-up doped epitaxial layer. Further, the semiconductor structure includes a second pull-down doped region, in the fin on the another side of the gate structure in the pull-down transistor region. The second pull-down doped region is a non-epitaxial layer doped region.

Other aspects of the present disclosure can be understood by those skilled in the art in light of the description, the claims, and the drawings of the present disclosure.

BRIEF DESCRIPTION OF THE DRAWINGS

Reference will now be made in detail to exemplary embodiments of the disclosure, which are illustrated in the accompanying drawings. Wherever possible, the same reference numbers will be used throughout the drawings to refer to the same or the alike parts.

DETAILED DESCRIPTION

Figure 1:
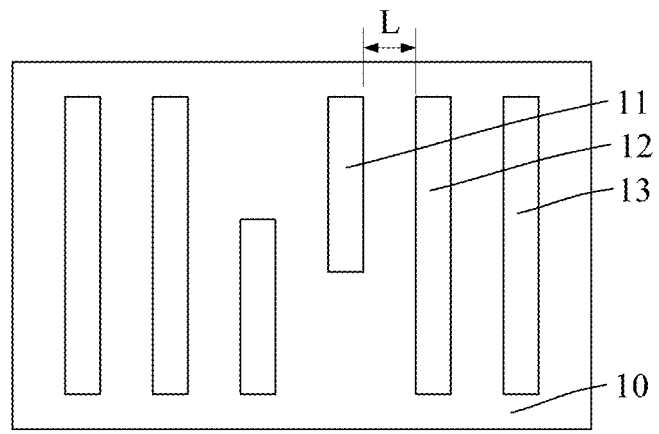
FIG. 1 illustrates a top view of a semiconductor structure corresponding to certain stage for forming the semiconductor structure.

FIG. 1 illustrates a top view of a portion of a semiconductor structure. FIG. 1 illustrate a substrate and fins. The semiconductor structure may also include other components. A method for forming the semiconductor structure includes providing a base substrate for forming a static random access memory (SRAM). The base substrate includes a substrate 10 and a plurality of discrete fins (not illustrated) on the substrate 10. The substrate 10 includes a pull-up transistor region (not illustrated) and a pull-down transistor region (not illustrated). The pull-down transistor region includes a first pull-down transistor region (not illustrated) and a second pull-down transistor region (not illustrated), and the first pull-down transistor region is adjacent to the pull-up transistor region. The fin on the substrate 10 in the pull-up transistor region is referred to a first fin 11. The fin on the substrate 10 in the first pull-down transistor region is referred to a second fin 12. The fin on the substrate 10 in the second pull-down transistor region is referred to a third fin 13. The method for forming the semiconductor structure includes forming a gate structure, across a length portion of each fin, covering portions of top and sidewall surfaces of each fin and on each fin. In addition, the method for forming the semiconductor structure includes forming pull-up doped epitaxial layers (not illustrated) in the first fin 11 on both sides of the gate structure in the pull-up transistor region. Further, the method for forming the semiconductor structure includes forming pull-down doped epitaxial layers (not illustrated) in the second fin 12 on both sides of the gate structure in the first pull-down transistor region, and in the third fin 13 on both sides of the gate structure in the second pull-down transistor region.

When forming the semiconductor structure, the base substrate may be used not only to form a SRAM device, but also to form a logic region of a logic device. To increase carrier mobility of the formed device and to reduce a contact resistance between subsequently formed metal silicide and the doped epitaxial layer, volume of the pull-up doped epitaxial layers and pull-down epitaxial layers may be large, and volume of the doped epitaxial layers of the formed logic region may be large.

Figure 2:
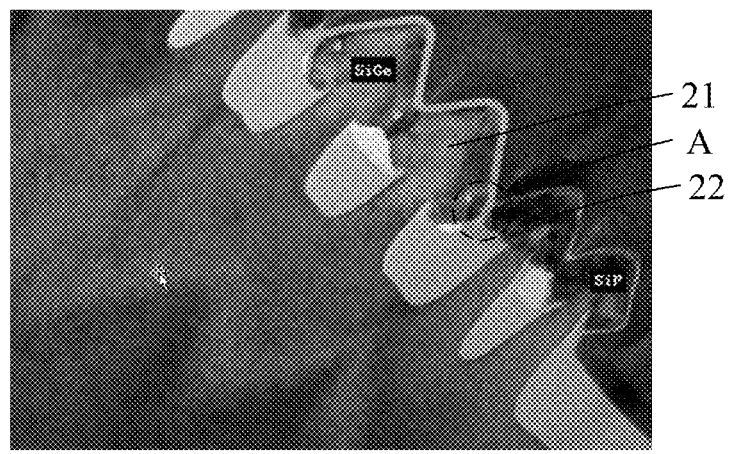
FIG. 2 illustrates an electron microscopy image of the semiconductor structure formed according to FIG. 1.

FIG. 2 illustrates an electron microscopy image of a semiconductor structure formed by the above-described method. Referring to FIG. 2, as feature dimensions of the integrated circuits continue to decrease, a distance as illustrated in FIG. 1 between the first fin 11 and the second fin 12 decreases. A bridging phenomenon (illustrated as region 'A' in FIG. 2) may occur between the pull-up doped epitaxial layer 21 in the first fin 11 and the pull-down doped epitaxial layer 22 in the second fin 12. To avoid adversely affecting the electrical performance of the device in the logic region, it is difficult to avoid occurrence of the bridging phenomenon by reducing the volume of the doped epitaxial layer.

Figure 20:
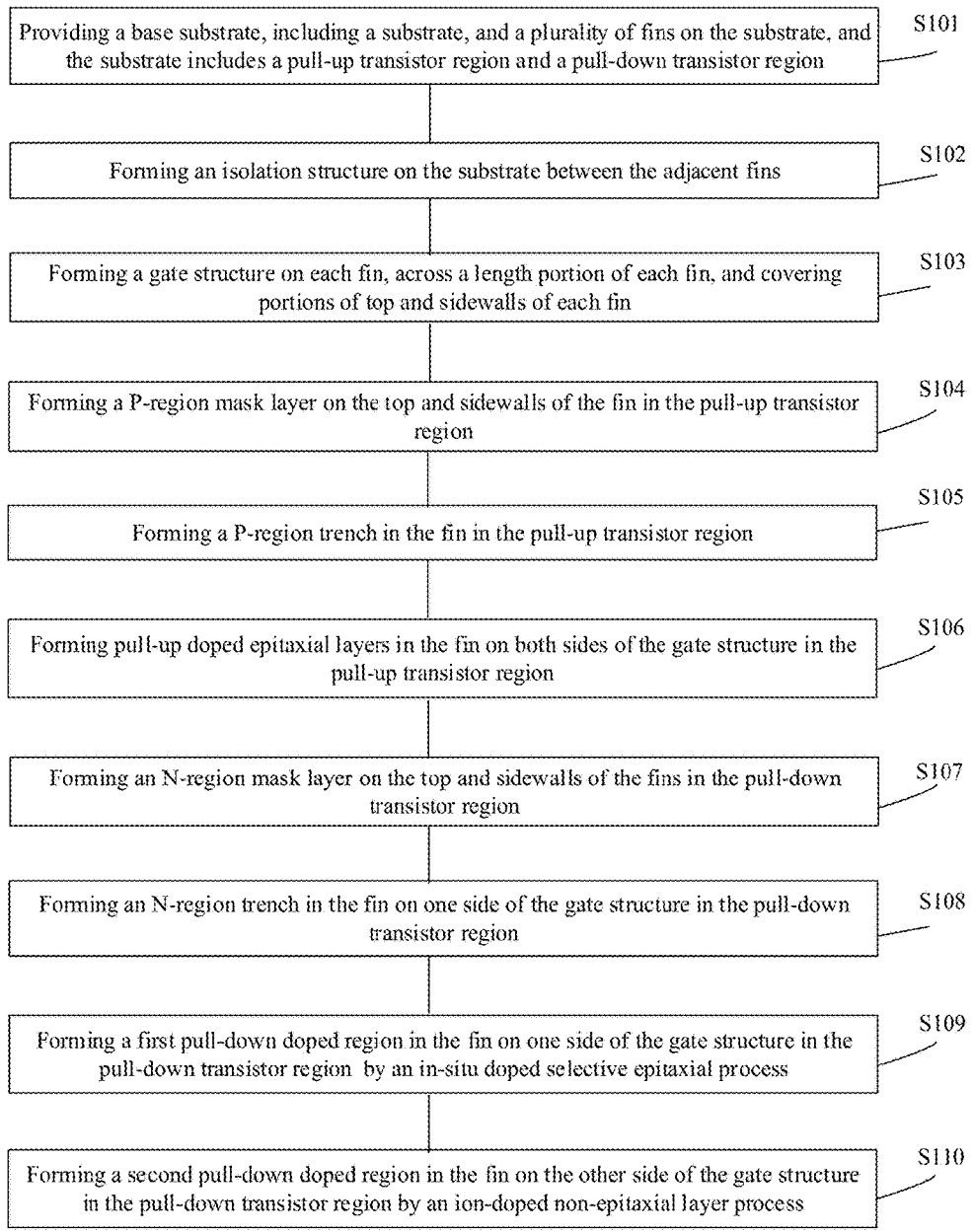
FIG. 20 illustrates an exemplary fabrication method for forming a semiconductor structure consistent with various disclosed embodiments of the present disclosure.

The present disclosure provides a semiconductor structure, SRAM and fabrication method thereof. FIG. 20 illustrates an exemplary fabrication method for forming a semiconductor structure consistent with various disclosed embodiments of the present disclosure; and FIGS. 3-16 illustrate semiconductor structures corresponding to certain stages of the exemplary fabrication method.

Figure 3:
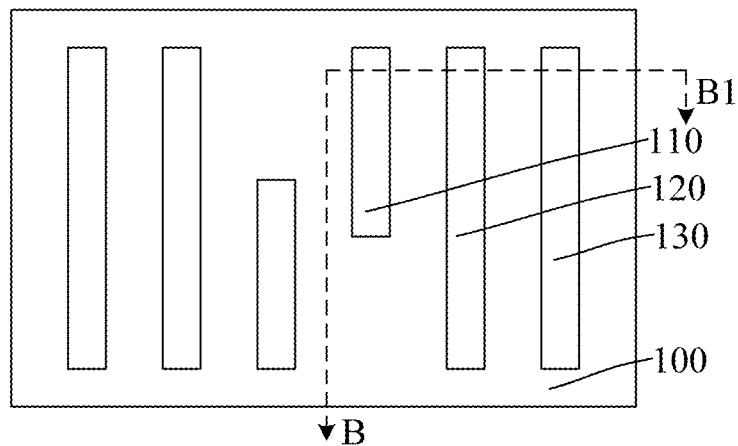
FIGS. 3-16 illustrate semiconductor structures corresponding to certain stages of an exemplary fabrication method for forming a semiconductor structure consistent with various disclosed embodiments of the present disclosure.
Figure 4:
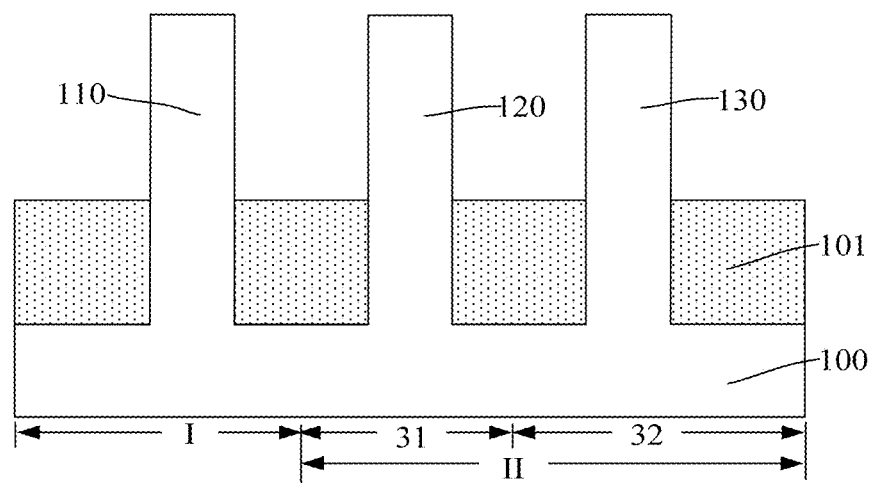

As shown in FIG. 20, at the beginning of the fabrication method, a base substrate may be provided (S101). FIGS. 3-4 illustrate a corresponding semiconductor structure.

FIG. 3 illustrates a top-view of a portion of the semiconductor structure. FIG. 1 illustrate a substrate and fins. The semiconductor structure may also include other components. FIG. 4 illustrates a cross-sectional view along a line 'BB1' in FIG. 3. Referring to FIGS. 3-4, a base substrate may be provided. In one embodiment, the base substrate may include a substrate 100 and a plurality of discrete fins (not illustrated) on the substrate 100. The substrate 100 may include a pull-up transistor region I (illustrated in FIG. 4) and a pull-down transistor region II (illustrated in FIG. 4).

The base substrate may provide a platform for subsequently forming the semiconductor structure. In one embodiment, the base substrate may provide a platform for subsequently forming a SRAM. The SRAM may include a fin field effect transistor (FinFET), thus the pull-up transistor region I may include a PMOS region, and the pull-down transistor region II may include an NMOS region.

To improve a device current of the SRAM cell region, the pull-down transistor region II may include a first pull-down transistor region 31 and a second pull-down transistor region 32, adjacent to each other along a direction perpendicular to a length direction of fin. The first pull-down transistor region 31 may be adjacent to the pull-up transistor region I.

The pull-down transistor region II may be used to form a pull-down transistor. The first pull-down transistor region 31 may be used to form a first pull-down transistor, and the second pull-down transistor region 32 may be used to form a second pull-down transistor. The first pull-down transistor and the second pull-down transistor may form the parallel pull-down transistor. Correspondingly, both the first pull-down transistor region 31 and the second pull-down transistor region 32 may include NMOS regions. Therefore, in one embodiment, a fin may be formed on the substrate 100 in the first pull-down transistor region 31, and another fin may be formed on the substrate 100 in the second pull-down transistor region 32.

In one embodiment, the fin on the substrate 100 in the pull-up transistor region I may be referred to a first fin 110. The fin on the substrate 100 in the first pull-down transistor region 31 may be referred to a second fin 120. The fin on the substrate 100 in the second pull-down transistor region 32 may be referred to a third fin 130.

In one embodiment, the substrate 100 may be a silicon substrate. In certain embodiments, the substrate may be made of germanium, silicon germanium, silicon carbide, gallium arsenide, or indium gallium, etc. The substrate may also be a silicon on insulator (SOI) substrate, a germanium on insulator (GOI) substrate, a glass substrate, or Group III-V compounds substrates, such as a gallium arsenide (GaAs) substrate, or a gallium nitride (GaN) substrate, etc.

The fins may be made of the same material as the substrate 100. In one embodiment, the fins may be made of silicon. In other words, the first fin 110, the second fin 120, and the third fin 130 may be made of silicon. In certain embodiments, the fins may be made of germanium, silicon germanium, silicon carbide, gallium arsenide, or indium gallium, etc.

In one embodiment, forming the substrate 100 and the fins may include: providing an initial substrate; forming a patterned first hard mask layer (not illustrated) on the initial substrate; and etching the initial substrate by using the first hard mask layer as a mask to form the substrate 100 and the fins protruding on the substrate 100.

In one embodiment, the first hard mask layer on the top of the fins may be retained after forming the substrate 100 and the fins. The first hard mask layer may be made of silicon nitride. The first hard mask layer may be used to define a stop position of a planarization process and to protect the top of the fins when subsequently performing a planarization process.

Returning to FIG. 20, after forming the base substrate, an isolation structure may be formed (S102). FIG. 4 illustrates a corresponding semiconductor structure.

Referring to FIG. 4, after providing the base substrate, an isolation structure 101 may be formed on the substrate 100 between the adjacent fins. The isolation structure 101 may cover portions of sidewalls of the fins, and top of the isolation structure 101 may be lower than top of the fins.

The isolation structure 101 serving as an isolation structure of the semiconductor structure may be used to isolate adjacent devices. In one embodiment, the isolation structure 101 may be made of silicon oxide. In certain embodiments, the isolation structure may be made of silicon nitride, or silicon oxynitride, etc.

In one embodiment, a method for forming the isolation structure 101 may include: filling an isolation material on the substrate 100 between the adjacent fins, where top of the isolation material may be above top of the first hard mask layer (not illustrated); polishing to remove the isolation material above the top of the first hard mask layer to form an isolation film; back-etching portions of a thickness of the isolation film until the top and portions of the sidewalls of the fins are exposed to form the isolation structure 101; and removing the first hard mask layer.

Subsequent processes may include forming a gate structure across a length portion of each fin, and forming a second pull-down doped region in the fin on one side of the gate structure in the pull-down transistor region II. The second pull-down doped region may be formed by performing an ion-doped non-epitaxial layer process on the fin. In other words, an epitaxial layer may not be formed when forming the second pull-down doped region, and an ion doping process may be directly performed on the fin. Therefore, to prevent the electrical performance of the formed pull-down transistor from being affected, in one embodiment, after forming the isolation film and before back-etching portions of the thickness of the isolation film, a pull-down threshold adjustment implantation (VT Implant) treatment may be performed on the base substrate corresponding to the second pull-down doped region. Doped ions of the pull-down threshold adjustment implantation treatment may include N-type ions, and the N-type ions may include P, As or Sb, etc.

Parameters of the pull-down threshold adjustment implantation treatment may be dependent on the process requirements. In one embodiment, the parameters of the pull-down threshold adjustment implantation treatment may include: implantation ion energy in a range of approximately 1 KeV-10 KeV, and an implantation ion dose in a range of approximately $1 \times 10^{13}$ atoms/cm$^3$-$5 \times 10^{14}$ atoms/cm$^3$.

Figure 5:
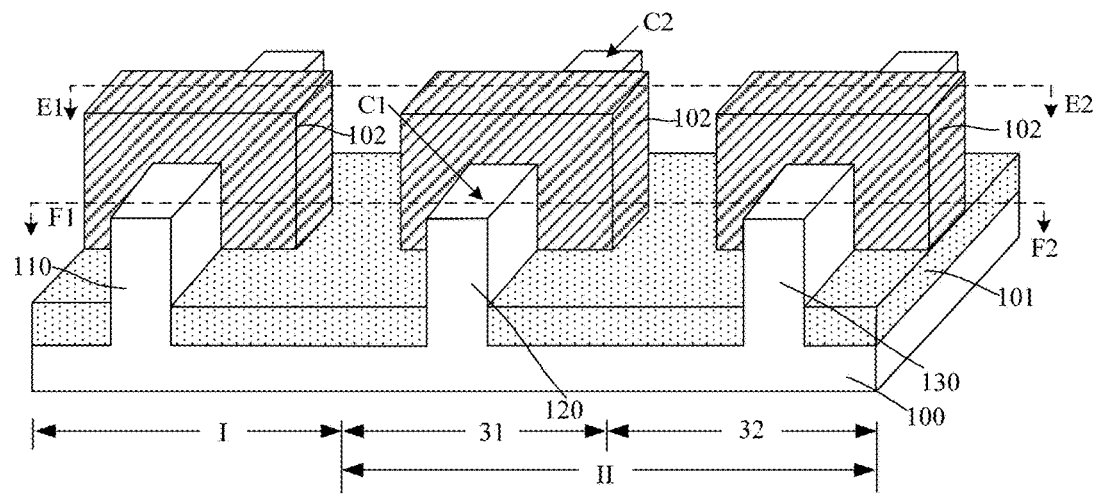
Figure 6:
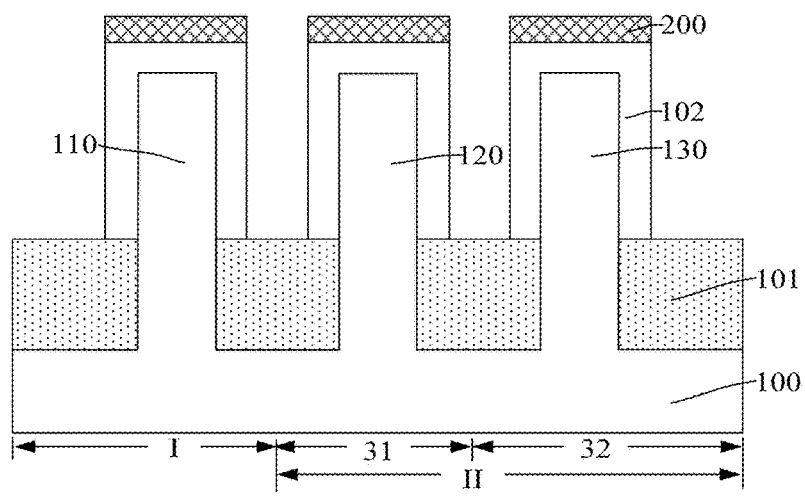

Returning to FIG. 14, after forming the isolation structure, a gate structure may be formed (S103). FIGS. 5-6 illustrate a corresponding semiconductor structure.

FIG. 5 illustrates a perspective view of a portion of the semiconductor structure. A second hard mask layer may not be illustrated in FIG. 5. FIG. 6 illustrates a cross-sectional view along a line 'E1E2' in FIG. 5. Referring to FIGS. 5-6, a gate structure 102 may be formed on each fin, across a length portion of each fin and covering portions of the top and sidewalls of each fin.

In one embodiment, the gate structure 102 may be formed on each fin in the pull-up transistor region I and the pull-down transistor region II. For example, the gate structure 102 in the pull-up transistor region I may be across a length portion of the first fin 110, and cover portions of the top and sidewalls of the first fin 110. The gate structure 102 in the first pull-down transistor region 31 may be across a length portion of the second fin 120, and cover portions of the top and sidewalls of the second fin 120. The gate structure 102 in the second pull-down transistor region 32 may be across a length portion of the third fin 130, and cover portions of the top and sidewalls of the third fin 130.

In one embodiment, a high-K metal gate-last process may be used to form the semiconductor structure, thus the gate structure 102 may be a dummy gate structure. The gate structure 102 may occupy a spatial location for subsequently forming a real gate structure of the semiconductor structure.

The gate structure 102 may be a single-layer structure, or a stacked layer structure. The gate structure 102 may include a dummy gate layer; or the gate structure 102 may include a dummy oxide layer and a dummy gate layer on the dummy oxide layer. The dummy gate layer may be made of polysilicon, silicon oxide, silicon nitride, silicon oxynitride, silicon carbide, silicon carbonitride, silicon carboxynitride, or amorphous carbon, etc. The dummy oxide layer may be made of silicon oxide, or silicon oxynitride, etc.

In one embodiment, a method for forming the gate structure 102 may include: forming a dummy gate film on the isolation structure 101, where the dummy gate film may be across a length portion of each fins, and cover portions of the top and sidewalls of each fin; forming a second hard mask layer 200 on the dummy gate film, where the second hard mask layer 200 may define a pattern of the gate structure 102 to be formed; and patterning the dummy gate film by using the second hard mask layer 200 as a mask to form the gate structure 102 on each fin in the pull-up transistor region I and the pull-down transistor region II.

In certain embodiments, the gate structure may be a real gate structure of a subsequently formed FinFET. The gate structure may include a gate dielectric layer and a gate electrode layer on the gate dielectric layer. The gate dielectric layer may be made of silicon oxide, or a high-K gate dielectric material, etc. The gate electrode layer may be made of polysilicon or a metal material, including one or more of Ti, Ta, TiN, TaN, TiAl, TiAlN, Cu, Al, W, Ag, and Au.

In one embodiment, after forming the gate structure 102, the second hard mask layer 200 on the top of the gate structure 102 may be retained. The second hard mask layer 200 may be made of silicon nitride. The second hard mask layer 200 may be used to protect the top of the gate structure 102 during subsequent processes. In certain embodiments, the second hard mask layer may be made of silicon oxynitride, silicon carbide, or boron nitride, etc. In another embodiment, the second hard mask layer 200 may be removed from the gate structure 102.

The subsequent processes may include: forming pull-up doped epitaxial layers in the first fin 110 on both sides of the gate structure 102 in the pull-up transistor region I; forming a first pull-down doped region in the second fin 120 on one side of the gate structure 102 in the first pull-down transistor region 31 (illustrated as region 'C1' in FIG. 5), where the first pull-down doped region may be connected to the adjacent pull-up doped epitaxial layer; forming a second pull-down doped region in the second fin 120 on the other side of the gate structure 102 in the first pull-down transistor region 31 (illustrated as region 'C2' in FIG. 5); and forming third pull-down doped regions in the third fin 130 on both sides of the gate structure 102 in the second pull-down transistor region 32.

As the feature dimensions of the integrated circuits continue to decrease, a distance between the first fin 110 and the second fin 120 along a direction perpendicular to the length direction of the fins decreases. Therefore, to avoid the occurrence of a bridging phenomenon between the second pull-down doped region and the adjacent pull-up doped epitaxial layer, an ion-doped non-epitaxial layer process may be performed on the fin to form the second pull-down doped region. Compared to the selective epitaxial process, the method in the present disclosure can reduce the risk of bridging the second pull-down doped region with the adjacent pull-up doped epitaxial layer.

Figure 7:
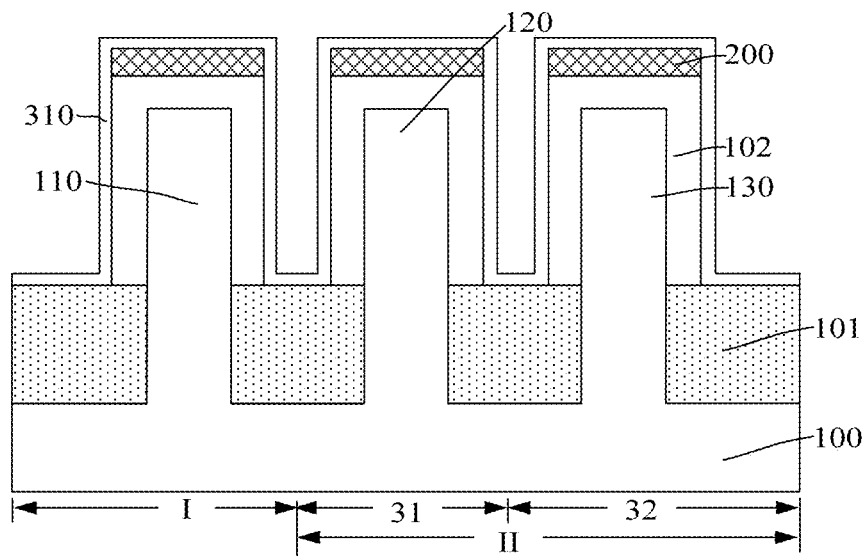
Figure 8:
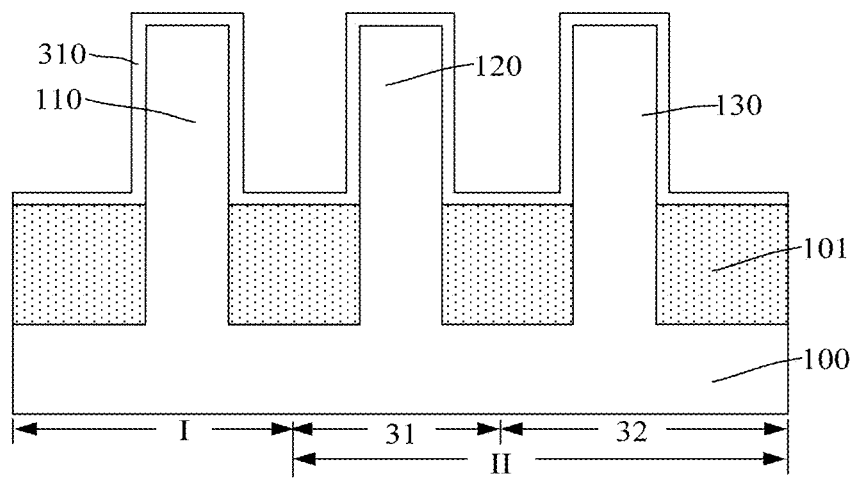

In one embodiment, the pull-up doped epitaxial layers may be first formed as an example. In another embodiment, the pull-up doped epitaxial layers may be formed after forming a first pull-down doped region, a second pull-down doped region and a third pull-down doped region. Returning to FIG. 20, after forming the gate structure, a P-region mask layer may be formed (S104). FIGS. 7-8 illustrate a corresponding semiconductor structure.

FIG. 7 illustrates a cross-sectional view on the basis of FIG. 6, and FIG. 8 illustrates a cross-sectional view along a line 'F1F2' in FIG. 5. Referring to FIGS. 7-8, a P-region mask layer 310 may be formed on the top and sidewalls of the fin in the pull-up transistor region. For example, the P-region mask layer 310 may be formed on the top and sidewalls of the first fin 110.

In one embodiment, the P-region mask layer 310 may be formed on the top and sidewalls of the second fin 120, and on the top and sidewalls of the third fin 130. The P-region mask layer 310 may be formed on the top and sidewalls of the gate structure 102 in the pull-up transistor region I, on the top and sidewalls of the gate structure 102 in the pull-down transistor region II, and on the isolation structure 101. The P-region mask layer 310 may be formed by a chemical vapor deposition process, a physical vapor deposition process, or an atomic layer deposition process, etc. In one embodiment, the P-region mask layer 310 may be formed by the atomic layer deposition process.

On the one hand, the P-region mask layer 310 may be used to protect the sidewalls of the fins from an epitaxial growth process performed on the sidewalls of the first fin 110, the second fin 120 and the third fin 130, when subsequently forming the pull-up doped epitaxial layers. On the other hand, the P-region mask layer 310 in the pull-down transistor region II may be a part of an N-region mask layer subsequently formed in the pull-down transistor region II.

The P-region mask layer 310 may be made of silicon nitride, silicon oxide, boron nitride, or silicon oxynitride, etc. The P-region mask layer 310 may be made of a material different from the fins and the isolation structure 101. In one embodiment, the P-region mask layer 310 may be made of silicon nitride.

The cross-sectional schematics provided in the subsequent fabrication processes are formed on the basis of FIG. 8, unless otherwise specified.

Figure 9:
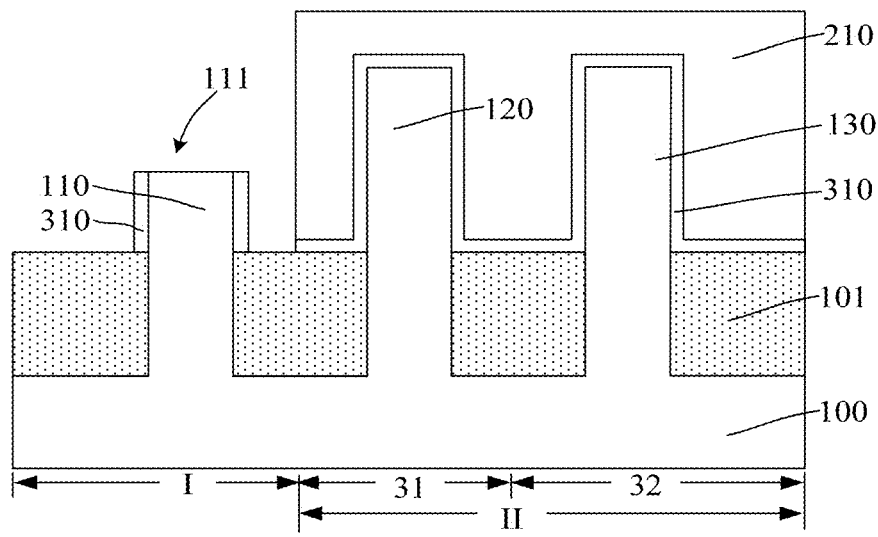

Returning to FIG. 20, after forming the P-region mask layer, a P-region trench may be formed (S105). FIG. 9 illustrates a corresponding semiconductor structure.

Referring to FIG. 9, the P-region mask layer 310 on the top of the fin on both sides of the gate structure 102 in the pull-up transistor region I (illustrated in FIG. 5) may be etched to expose the top surface of the fin on both sides of the gate structure 102 in the pull-up transistor region I. Portions of a thickness of the fin in the pull-up transistor region I may be etched to form a P-region trench 111 in the fin in the pull-up transistor region I. The P-region trench 111 may provide a spatial location for subsequently forming pull-up doped epitaxial layers.

In one embodiment, before etching the P-region mask layer 310 on the top of the first fin 110 on both sides of the gate structure 102 in the pull-up transistor region I, a first patterned layer 210 may be formed on the pull-down transistor region II. The first patterned layer 210 may cover the P-region mask layer 310 in the pull-down transistor region II. The first patterned layer 210 may protect the P-region mask layer 310 in the pull-down transistor region II. The first patterned layer 210 may also cover regions, in the pull-up transistor region I, that are not expected to be etched.

In one embodiment, the first patterned layer 210 may be made of a photoresist material. After forming the P-region trench 111, the first patterned layer 210 may be removed by a wet process, or an ashing process, etc.

In one embodiment, a dry etching process may be performed to remove the P-region mask layer 310 on the top of the first fin 110 on both sides of the gate structure 102 in the pull-up transistor region I. The P-region mask layer 310 on the top of the gate structure 102 and on portions of the isolation structure 101 in the pull-up transistor region I may also be etched when etching the P-region mask layer 310 on the top of the first fin 110 on both sides of the gate structure 102 in the pull-up transistor region I. After exposing the top of the first fin 110 on both sides of the gate structure 102 in the pull-up transistor region I, portions of a thickness of the exposed first fin 110 may continue to be etched to form the P-region trench 111.

The pull-up doped epitaxial layers may be subsequently formed in the P-region trench 111. The pull-up doped epitaxial layers may be used to provide a compressive stress to a channel region of the pull-up transistor to increase the carrier mobility of the pull-up transistor. The increasing of volume of the pull-up doped epitaxial layers may be beneficial for increasing the carrier mobility. Further, the increasing of the volume of the pull-up doped epitaxial layers may also be beneficial for reducing a contact resistance between the subsequently formed metal silicide and the pull-up doped epitaxial layer.

In one embodiment, to increase the volume of the pull-up doped epitaxial layers formed in the P-region trench 111, the P-region mask layer 310 on the sidewalls of the first fin 110 may be etched when etching the first fin 110. Therefore, after forming the P-region trench 111, the P-region mask layer 310 on the sidewalls of the first fin 110 may be coplanar with the top of the first fin 110.

After forming the P-region trench 111, a cleaning process may be performed on the P-region trench 111. The cleaning process may be used not only to remove impurities on the surface of the P-region trench 111, but also to remove an oxide layer (not illustrated) on the surface of the first fin 110, providing a desired interface for subsequently forming the pull-up doped epitaxial layers in the P-region trench 111.

The cleaning solution used in the cleaning process may be a combination of a mixed solution (SC1 solution), including ammonia, hydrogen peroxide and water, and diluted hydrofluoric acid (DHF), or a combination of ozone water, SC1 solution and DHF.

Figure 10:
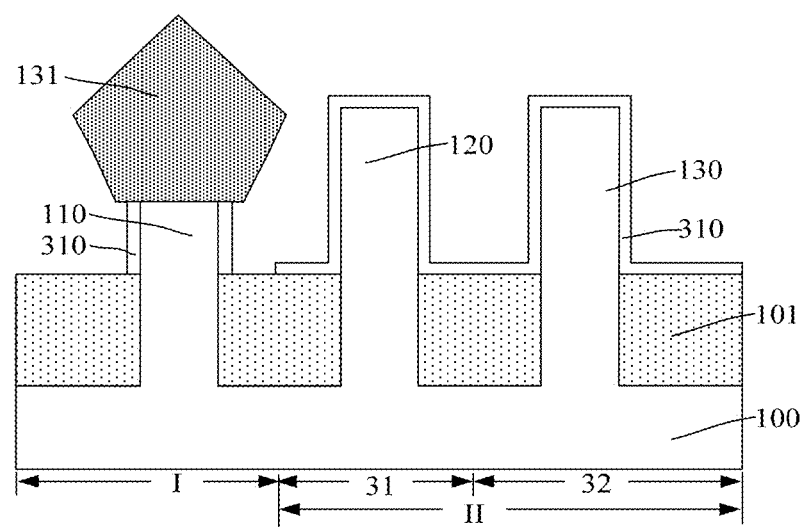

Returning to FIG. 20, after forming the N-region trench, pull-up doped epitaxial layers may be formed (S106). FIG. 10 illustrates a corresponding semiconductor structure.

Referring to FIG. 10, pull-up doped epitaxial layers 131 may be formed in the fin (not illustrated) on both sides of the gate structure 102 in the pull-up transistor region I. In one embodiment, the pull-up transistor region I may include a PMOS region, thus the pull-up doped epitaxial layers 131 may be doped with P-type ions.

In one embodiment, the process for forming the pull-up doped epitaxial layers 131 may include an in-situ doped selective epitaxial process. A method for forming the pull-up doped epitaxial layers 131 may include: forming pull-up epitaxial layers (not illustrated) in the first fin 110 on both sides of the gate structure 102 in the pull-up transistor region I; and in-situ self-doping P-type ions during the process for forming the pull-up epitaxial layers to form the pull-up doped epitaxial layers 131.

In one embodiment, the pull-up epitaxial layers may be formed in the P-region trench 111 (illustrated in FIG. 9), and the P-type ions may be in-situ self-doped during the process for forming the pull-up epitaxial layers to form the pull-up doped epitaxial layers 131.

The pull-up doped epitaxial layers 131 may be made of P-type doped silicon or SiGe, etc. In one embodiment, the pull-up epitaxial layers may be made of silicon, and the P-type ions may include Ge ions. Therefore, the pull-up doped epitaxial layers 131 may be made of Si doped with Ge ions. In other words, the pull-up doped epitaxial layers 131 may be made of SiGe.

The concentration of the Ge ions in the pull-up doped epitaxial layers 131 may be dependent on the process requirements. In one embodiment, the concentration of the Ge ions in the pull-up doped epitaxial layers 131 may be in a range of approximately $5.02 \times 10^{21}$ atoms/cm$^3$-$2.5 \times 10^{22}$ atoms/cm$^3$.

In certain embodiments, after forming the pull-up epitaxial layers in the P-region trench, a P-type ions doping process may be performed on the pull-up epitaxial layers to form the pull-up doped epitaxial layers. The pull-up epitaxial layers may provide a compressive stress to the channel region of the pull-up transistor region I, thus the carrier mobility of the pull-up transistor may increase.

In one embodiment, the top of the pull-up doped epitaxial layers 131 may be above the top of the P-region trench 111. Because of the characteristics of the selective epitaxial process, the sidewall surfaces of the pull-up doped epitaxial layers 131 above the top of the P-region trench 111 may have a vertex that protrudes away from the first fin 110. In certain embodiments, the top of the pull-up doped epitaxial layers may be coplanar with the top of the P-region trench.

The volume of the pull-up doped epitaxial layers 131 may be large, such that the pull-up doped epitaxial layers 131 may effectively improve the carrier mobility of the pull-up transistor. The top surface areas of the pull-up doped epitaxial layers 131 may be large, such that after subsequently forming the metal silicide on the pull-up doped epitaxial layers 131, the contact resistance between the metal silicide and each pull-up doped epitaxial layer 131 may be small.

In addition, to avoid process damages on the surfaces of the pull-up doped epitaxial layers 131 caused by subsequent processes, after forming the pull-up doped epitaxial layers 131, an oxidation treatment may be performed on the surfaces of the pull-up doped epitaxial layers 131 to form an oxidation protection layer (not illustrated) on the surface of each pull-up doped epitaxial layer 131. The oxidation treatment may include a dry oxygen oxidation, a wet oxygen oxidation, or a water vapor oxidation, etc.

Figure 11:
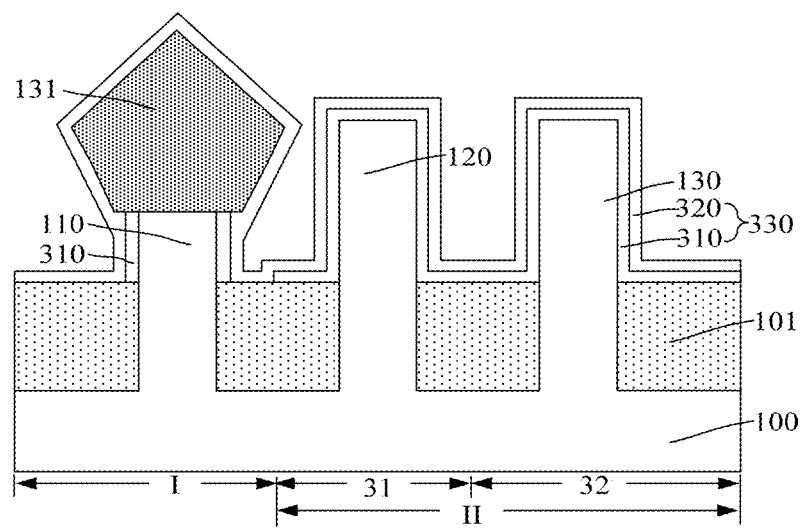

Returning to FIG. 20, after forming the pull-up doped epitaxial layers, an N-region mask layer may be formed (S107). FIG. 11 illustrates a corresponding semiconductor structure.

Referring to FIG. 11, an N-region mask layer 330 may be formed on the top and sidewalls of the fins (not illustrated) in the pull-down transistor region II after forming the pull-up doped epitaxial layers 131.

In one embodiment, the method for forming the N-region mask layer 330 may include forming an N-region mask sidewall spacer 320 on the P-region mask layer 310 in the pull-down transistor region II after forming the pull-up doped epitaxial layers 131. The N-region mask layer 330 may include the N-region mask sidewall spacer 320 and the P-region mask layer 310 in the pull-down transistor region II.

In one embodiment, the N-region mask sidewall spacer 320 may be formed on the top and sidewalls of the gate structure 102 in the pull-down transistor region II and on the isolation structure 101 in the pull-down transistor region II.

In one embodiment, to reduce the process difficulty and to save the mask, the N-region mask sidewall spacer 320 may be formed on the pull-up doped epitaxial layers 131, on the top and sidewalls of the gate structure 102 in the pull-up transistor region I, and on the isolation structure 101 in the pull-up transistor region I. The material and the fabrication method of the N-region mask sidewall spacer 320 may be referred to the corresponding description of the above-described P-region mask layer 310, and are not repeated herein.

The N-region mask layer 330, including the N-region mask sidewall spacer 320 and the P-region mask layer 310 and having the stacked layer structure, may be used as a mask when subsequently forming pull-down doped regions in the fin on both sides of the gate structure 102 in the pull-down transistor region II. Therefore, a distance between the subsequently formed pull-down doped regions and the channel region of the pull-down transistor region II may increase via the N-region mask sidewall spacer 320, and the short channel effect may be improved.

Figure 12:
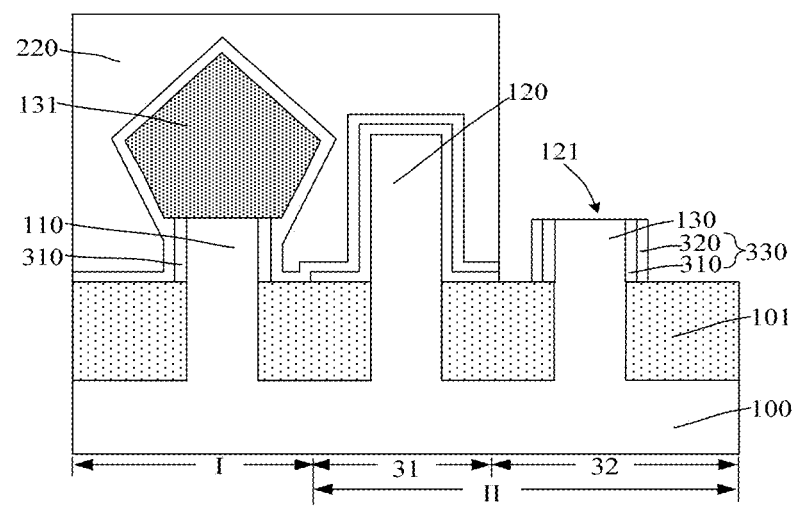

Returning to FIG. 20, after forming the N-region mask sidewall spacer, an N-region trench may be formed (S108). FIG. 12 illustrates a corresponding semiconductor structure.

Referring to FIG. 12, the N-region mask layer 330 on the top of the fin on one side of the gate structure 102 in the pull-down transistor region II (illustrated as region 'C1' in FIG. 5) may be etched to expose the top surface of the fin on one side of the gate structure 102 in the pull-down transistor region II. Portions of a thickness of the exposed fin in the pull-down transistor region II may be etched to form an N-region trench 121 in the fin on one side of the gate structure 102 in the pull-down transistor region II.

To avoid the occurrence of a bridging phenomenon between a subsequently formed second pull-down doped region and the adjacent pull-up doped epitaxial layer 131, an ion-doped non-epitaxial layer process may be performed to form the second pull-down doped region. Therefore, in the present disclosure, the N-region trench 121 may be formed in the second fin 120 on one side of the gate structure 102 in the first pull-down transistor region 31 when forming the N-region trench 121.

In one embodiment, the N-region mask layer 330 on the top of the third fin 130 on both sides of the gate structure 102 in the second pull-down transistor region 32 may be etched to expose the top surface of the third fin 130 on both sides of the gate structure 102 in the second pull-down transistor region 32. Portions of a thickness of the third fin 130 may be etched to form the N-region trench 121 in the third fin 130 on both sides of the gate structure 102 in the second pull-down transistor region 32.

In one embodiment, to simplify the process steps and to save the mask, the N-region trench 121, in the second fin 120 on one side of the gate structure 102 in the first pull-down transistor region 31 and in the third fin 130 on both sides of the gate structure 102 in the second pull-down transistor region 32, may be formed in a same, single step.

The N-region trench 121 in the second fin 120 may provide a spatial location for subsequently forming a first pull-down doped region in the second fin 120 on one side of the gate structure 102 in the first pull-down transistor region 31. The N-region trench 121 in the third fin 130 may provide spatial locations for subsequently forming third pull-down doped regions in the third fin 130 on both sides of the gate structure 102 in the second pull-down transistor region 32.

In one embodiment, before etching the N-region mask layer 330, a second patterned layer 220 may be formed to cover the pull-up transistor region I and the second fin 120 on the other side of the gate structure 102 in the first pull-down transistor region 31 (illustrated as region 'C2' in FIG. 5). The second patterned layer 220 may cover the gate structure 102 in the pull-up transistor region I and the gate structure 102 and the isolation structure 101 in the pull-down transistor region II.

In one embodiment, the second patterned layer 220 may be formed on the N-region mask sidewall spacer 320, in the pull-up transistor region I and on the other side of the gate structure 102 in the first pull-down transistor region 31. The second patterned layer 220 may protect the regions, in the pull-down transistor region II, that are not expected to be etched.

In one embodiment, the second patterned layer 220 may be made of a photoresist material. After forming the N-region trench 121, the second patterned layer 220 may be removed by a wet process, or an ashing process, etc.

In one embodiment, a dry etching process may be performed to remove the N-region mask layer 330 on the top of the second fin 120 on one side of the gate structure 102 in the first pull-down transistor region 31 and on the top of the third fin 130 on both sides of the gate structure 102 in the second pull-down transistor region 32. The N-region mask layer 330 on the top of the gate structure 102 in the first pull-down transistor region 31, on the top of the gate structure 102 in the second pull-down transistor region 32, and on portions of the isolation structure 101, may be etched when etching the N-region mask layer 330. After exposing the top of the second fin 120 on one side of the gate structure 102 in the first pull-down transistor region 31 and the top of the third fin 130 on both sides of the gate structure 102 in the second pull-down transistor region 32, portions of a thickness of the exposed second fin 120 and third fin 130 may continue to be etched to form the N-region trench 121.

In one embodiment, metal silicide may be subsequently formed on the first pull-down doped region and the third pull-down doped regions. The contact resistance between the metal silicide and the first pull-down doped region as well as the third pull-down doped region may be inversely proportional to the top surface areas of the first pull-down doped region and the third pull-down doped region. The increasing of volume of the first pull-down doped region as well as the third pull-down doped regions may be beneficial for reducing the contact resistance.

In one embodiment, to increase volume of the first pull-down doped region as well as the third pull-down doped regions subsequently formed in the N-region trench 121, the N-region mask layer 330 on the sidewalls of the second fin 120 and on the sidewalls of the third fin 130 may be etched when etching the second fin 120 and the third fin 130.

Therefore, after forming the N-region trench 121, the N-region mask layer 330 on the sidewalls of the second fin 120 may be coplanar with the top of the second fin 120, and the N-region mask layer 330 on the sidewalls of the third fin 130 may be coplanar with the top of the third fin 130.

After forming the N-region trench 121, a cleaning process may be performed on the N-region trench 121. The cleaning process may be used not only to remove impurities on the surface of the N-region trench 121, but also to remove oxide layers (not illustrated) on the surfaces of the second fin 120 and the third fin 130, providing a desired interface for subsequently forming the first pull-down doped region and the third pull-down doped regions in the N-region trench 121.

The cleaning solution used in the cleaning process may be a combination of a mixed solution (SCl solution), including ammonia, hydrogen peroxide and water, and diluted hydrofluoric acid (DHF), or a combination of ozone water, SCl solution and DHF.

Figure 13:
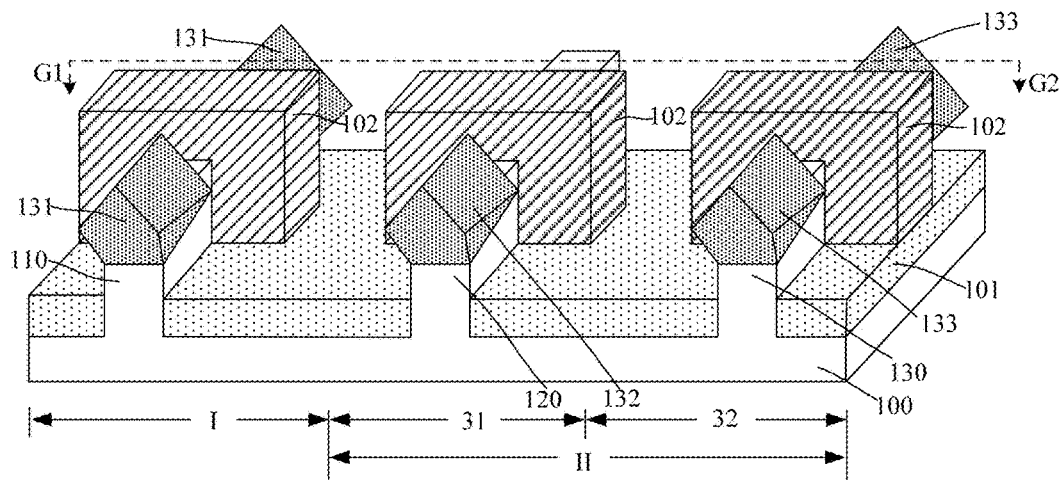
Figure 14:
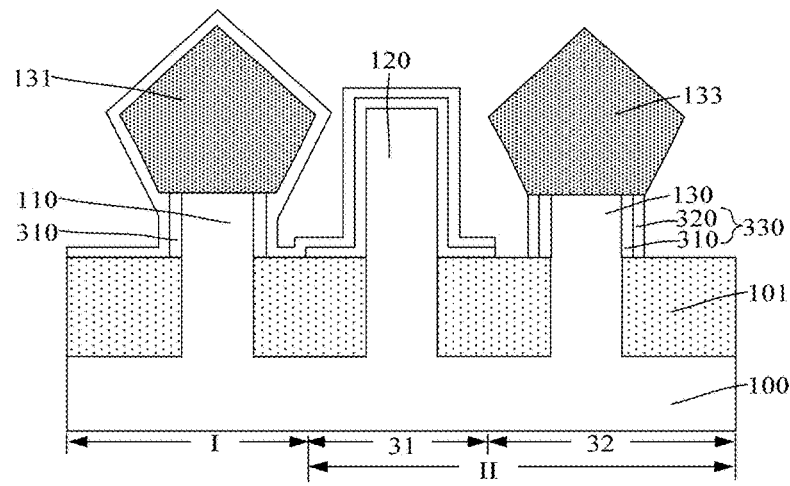

Returning to FIG. 20, after forming the N-region trench, first pull-down doped region may be formed (S109). FIGS. 13-14 illustrate a corresponding semiconductor structure.

FIG. 13 illustrates a perspective view of the semiconductor structure (the P-region mask layer and the N-region mask layer not illustrated). FIG. 14 illustrates a cross-sectional view along a line 'G1G2' in FIG. 13. Referring to FIGS. 13-14, a first pull-down doped region 132 (illustrated in FIG. 13) may be formed in the fin on one side of the gate structure in the pull-down transistor region II (illustrated as region 'C1' in FIG. 5). The first pull-down doped region 132 may be connected to the pull-up doped epitaxial layer 131.

In one embodiment, the first pull-down doped region 132 may be formed in the N-region trench 121 (illustrated in FIG. 12) in the first pull-down transistor region 31. In one embodiment, the pull-down transistor region II may include an NMOS region, thus the first pull-down doped region 132 may be doped with N-type ions.

Because the N-region trench 121 may be formed in the third fin 130 on both sides of the gate structure 102 in the second pull-down transistor region 32, third pull-down doped regions 133 may be formed in the N-region trench 121 in the second pull-down transistor region 32 when forming the first pull-down doped region 132. The third pull-down doped regions 133 may be made of the same material as the first pull-down doped region 132.

The process for forming the first pull-down doped region 132 and the third pull-down doped regions 133 may include an in-situ doped selective epitaxial process. In one embodiment, the method for forming the first pull-down doped region 132 and the third pull-down doped regions 133 may include: forming pull-down epitaxial layers (not illustrated) in the N-region trench 121; and in-situ self-doping N-type ions during the process for forming the pull-down epitaxial layers to form the first pull-down doped region 132 and the third pull-down doped regions 133.

The first pull-down doped region 132 may be made of N-type doped Si or SiC, etc. In one embodiment, the pull-down epitaxial layers may be made of Si, and the N-type ions may include P ions. Therefore, the first pull-down doped region 132 may be made of Si doped with P ions. In other words, the first pull-down doped region 132 may be made of SiP. Correspondingly, the third pull-down doped regions 133 may be made of SiP.

The concentration of the P ions in the first pull-down doped region 132 may be dependent on the process requirements. In one embodiment, the concentration of the P ions in the first pull-down doped region 132 may be in a range of approximately $1\times10^{20}$ atoms/cm$^3$-$2\times10^{21}$ atoms/cm$^3$. Correspondingly, the concentration of the P ions in the third pull-down doped regions 133 may be in a range of approximately $1\times10^{20}$ atoms/cm$^3$-$2\times10^{21}$ atoms/cm$^3$.

In certain embodiments, after forming the pull-down epitaxial layers in the N-region trench, an N-type ions doping process may be performed on the pull-down epitaxial layers to form first pull-down doped region and the third pull-down doped regions.

In one embodiment, the top of the pull-down epitaxial layers may be above the top of the N-region trench 121. Because of the characteristics of the selective epitaxial process, the sidewall surfaces of the pull-down epitaxial layer above the top of the N-region trench 121 in the first pull-down transistor region 31 may have a vertex that protrudes away from the second fin 120. The sidewall surfaces of the pull-down epitaxial layers above the top of the N-region trench 121 in the second pull-down transistor region 32 may have a vertex that protrudes away from the third fin 130. In certain embodiments, the top of the pull-down epitaxial layers may be coplanar with the top of the N-region trench.

Because the volume of the pull-down epitaxial layers may be large, the top surface areas of the first pull-down doped region 132 and the third pull-down doped regions 133 may be large. After subsequently forming the metal silicide on the first pull-down doped region 132 and on the third pull-down doped regions 133, the contact resistance between the metal silicide and the first pull-down doped region 132 as well as the third pull-down doped regions 133 may be small.

Figure 15:
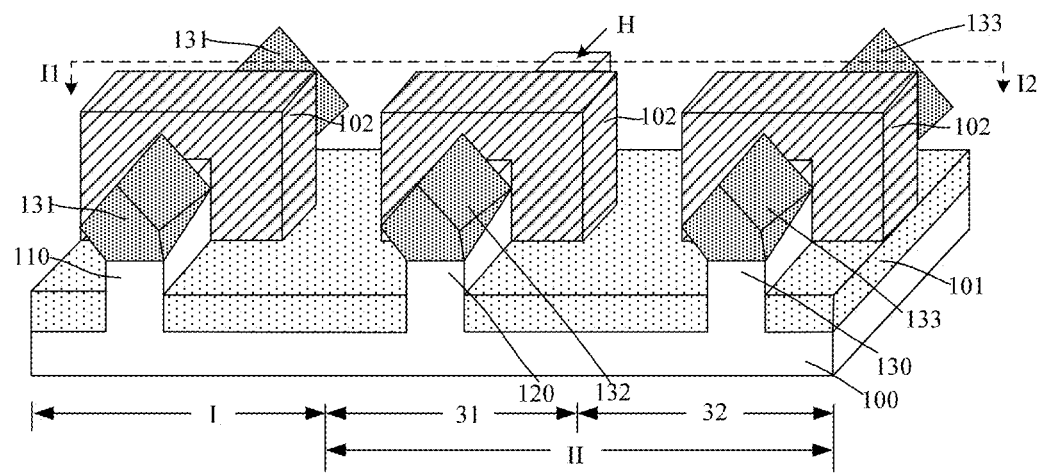
Figure 16:
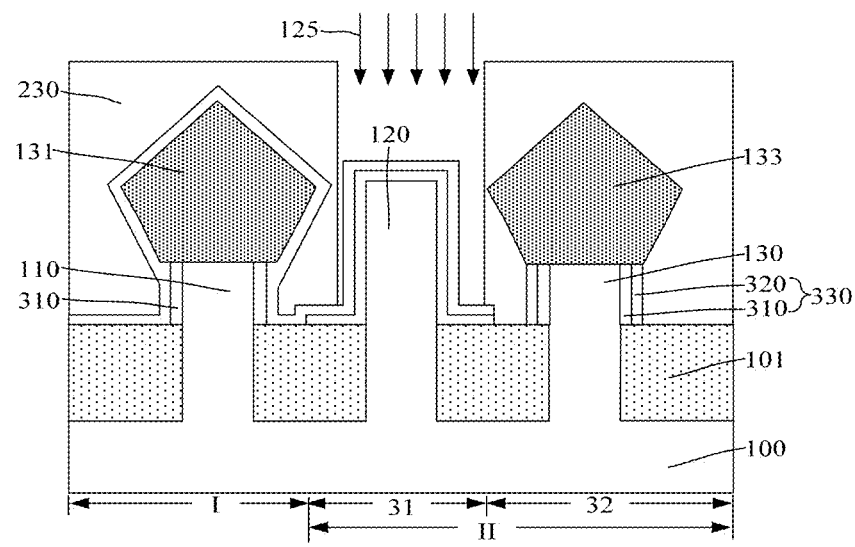

Returning to FIG. 20, after forming the first pull-down doped region and the third pull-down doped regions, a second pull-down doped region may be formed (S110). FIGS. 15-16 illustrate a corresponding semiconductor structure.

FIG. 15 illustrates a perspective view of the semiconductor structure on the basis of FIG. 13 (the P-region mask layer and the N-region mask layer not illustrated). FIG. 16 illustrates a cross-sectional view along a line 'I1I2' in FIG. 15. Referring to FIGS. 15-16, a second pull-down doped region (illustrated as region 'H' in FIG. 15) may be formed in the fin (not illustrated) on the other side of the gate structure in the pull-down transistor region II (illustrated as region 'C2' in FIG. 5). An ion-doped non-epitaxial layer process 125 may be performed on the fin to form the second pull-down doped region.

To avoid the occurrence of a bridging phenomenon between the second pull-down doped region and the adjacent pull-up doped epitaxial layer 131, the ion-doped non-epitaxial layer process 125 may be performed on the fin to form the second pull-down doped region. In other words, epitaxial layer (EPI) may not be formed in the fin on the other side of the gate structure 102 in the pull-down transistor region II, the ion-doped non-epitaxial layer process 125 may be directly performed on the fin.

In one embodiment, the pull-down transistor region II may include an NMOS region, thus the second pull-down doped region may be doped with N-type ions. In one embodiment, an N-type ion implantation process may be performed on the fin on the other side of the gate structure 102 in the pull-down transistor region II (illustrated as region 'C2' in FIG. 5).

In one embodiment, because the first pull-down transistor region 31 may be adjacent to the pull-up transistor region I, the N-type ion implantation process may be performed on the second fin 120 on the other side of the gate structure 102 in the first pull-down transistor region 31 to form the second pull-down doped region in the second fin 120 on the other side of the gate structure 102 in the first pull-down transistor region 31 when forming the second pull-down doped region.

In one embodiment, a third patterned layer 230 may be formed to cover the pull-up transistor region I, the second pull-down transistor region 32, and portions of the first pull-down transistor region 31. The third patterned layer 230 may expose the N-region mask layer 330 on the top of the second fin 120 on the other side of the gate structure 102 in the first pull-down transistor region 31. The ion-doped non-epitaxial process 125 may be performed on the N-region mask layer 330 by using the third patterned layer 230 as a mask to form the second pull-down doped region in the second fin 120 on the other side of the gate structure 102 in the first pull-down transistor region 31.

In one embodiment, doped ions may be implanted into the second fin 120 through the N-region mask layer 330, thus the second pull-down doped region may be formed in the second fin 120 on the other side of the gate structure 102 in the first pull-down transistor region 31.

In one embodiment, only the second pull-down doped region may be formed by the ion-doped non-epitaxial process, therefore the third patterned layer may cover the second pull-down transistor region 32. Implanted ions of the N-type ion implantation process may include P ions, or As ions, etc. Parameters of the N-type ion implantation process may be dependent on the process requirements. In one embodiment, parameters of the N-type ion implantation process may include the following. Implanted ions may be P ions, implantation ion energy may be in a range of approximately 1 KeV-4 KeV, and an implantation dose may be in a range of approximately $1\times10^{15}$ atoms/cm$^3$-$2\times10^{15}$ atoms/cm$^3$. Or, implanted ions may be As ions, implantation ion energy may be in a range of approximately 1 KeV-4 KeV, and an implantation dose of the As ions may be in a range of approximately $1\times10^{15}$ atoms/cm$^3$-$4\times10^{15}$ atoms/cm$^3$.

In one embodiment, the second pull-down doped region may be formed in the fin on the other side of the gate structure in the pull-down transistor region, and the second pull-down doped region may be formed by performing the ion-doped non-epitaxial layer process on the fin. In other words, the pull-down epitaxial layer may not be formed in the fin on the other side of the gate structure in the pull-down transistor region. The pull-down transistor region may be adjacent to the pull-up transistor region. Therefore, compared to the method for forming the second pull-down doped region by forming the pull-down epitaxial layer in the fin on the other side of the gate structure in the pull-down transistor region, the method consistent with the described embodiments can avoid the occurrence of the bridging issue between the second pull-down doped region and the pull-up doped epitaxial layer caused by the too small distance between the fin in the pull-down transistor region and the fin in the pull-up transistor region.

Figure 17:
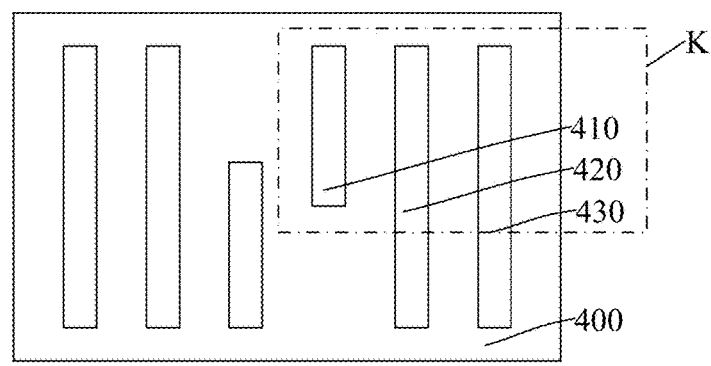
FIGS. 17-19 illustrate a semiconductor structure consistent with various disclosed embodiments of the present disclosure.
Figure 18:
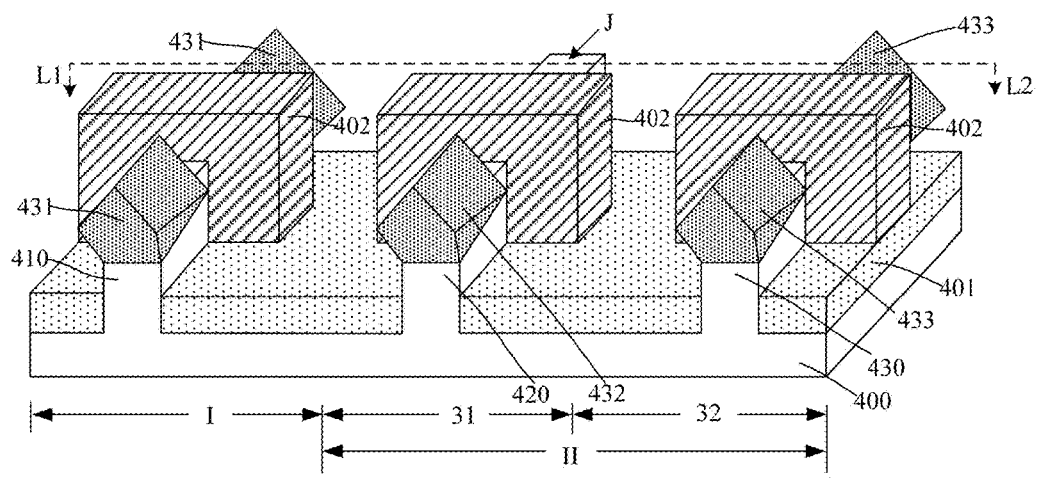
Figure 19:
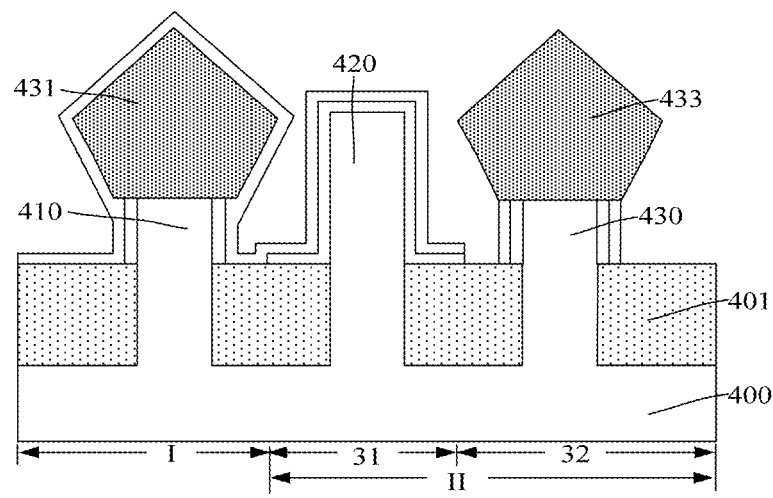

Correspondingly, a semiconductor structure is also provided in the present disclosure. FIGS. 17-19 illustrate a semiconductor structure consistent with the disclosed embodiments. FIG. 17 illustrates a top-view of a portion of the semiconductor structure. FIG. 17 illustrates a substrate and fins. The semiconductor structure may also include other components. FIG. 18 illustrates a perspective-view of region 'K' in FIG. 17, and FIG. 19 illustrates a cross-sectional view along a line 'L1L2' in FIG. 18.

Referring to FIGS. 17-19, the semiconductor structure may include a base substrate, including a substrate 400 and a plurality of discrete fins (not illustrated) on the substrate 400. The substrate 400 may include a pull-up transistor region I and a pull-down transistor region II adjacent to each other. The semiconductor structure may also include a gate structure 402, across a length portion of each fin, covering portions of top and sidewalls of each fin, and on each fin. In addition, the semiconductor structure may include pull-up doped epitaxial layers 431 in the fin on both sides of the gate structure 402 in the pull-up transistor region I, and a first pull-down doped region 432 in the fin on one side of the gate structure 402 in the pull-down transistor region II. The first pull-down doped region 432 may be connected to the adjacent pull-up doped epitaxial layer 431. Further, the semiconductor structure may include a second pull-down doped region (illustrated as region 'J' in FIG. 18) in the fin on the other side of the gate structure 402 in the pull-down transistor region II. The second pull-down doped region may be a non-epitaxial layer doped region.

In one embodiment, the semiconductor structure on the base substrate may include a static random access memory (SRAM), and the SRAM may include a FinFET. The pull-up transistor region I may include a PMOS region, and the pull-down transistor region II may include an NMOS region.

To improve a device current of the SRAM cell region, the pull-down transistor region II may include a first pull-down transistor region 31 and a second pull-down transistor region 32 adjacent to each other. The first pull-down transistor region 31 may be adjacent to the pull-up transistor region I. A transistor in the first pull-down transistor region 31 may be referred to a first pull-down transistor, and a transistor in the second pull-down transistor region 32 may be referred to a second pull-down transistor. The first pull-down transistor and the second pull-down transistor may form a parallel pull-down transistor. Correspondingly, both the first pull-down transistor region 31 and the second pull-down transistor region 32 may include NMOS regions. Therefore, in one embodiment, a fin may be formed on the substrate 400 in the first pull-down transistor region 31, and another fin may be formed on the substrate 400 in the second pull-down transistor region 32.

In one embodiment, the fin on the substrate 400 in the pull-up transistor region I may be referred to a first fin 410. The fin on the substrate 400 in the first pull-down transistor region 31 may be referred to a second fin 420. The fin on the substrate 400 in the second pull-down transistor region 32 may be referred to a third fin 430.

In one embodiment, the substrate 400 may be a silicon substrate. In certain embodiments, the substrate may be made of germanium, silicon germanium, silicon carbide, gallium arsenide, or indium gallium, etc. The substrate may also be a silicon on insulator (SOI) substrate, a germanium on insulator (GOI) substrate, a glass substrate, or Group III-V compounds substrates, such as a gallium arsenide (GaAs) substrate, or a gallium nitride (GaN) substrate, etc.

The fins may be made of the same material as the substrate 400. In one embodiment, the fins may be made of silicon. In other words, the first fin 410, the second fin 420, and the third fin 430 may be made of silicon. In certain embodiments, the fins may be made of germanium, silicon germanium, silicon carbide, gallium arsenide, or indium gallium, etc.

Moreover, the semiconductor structure may include an isolation structure 401 formed on the substrate 400 between the adjacent fins. The isolation structure 401 may cover portions of sidewalls of the fins, and top of the isolation structure 401 may be lower than the top of the fins.

The isolation structure 401 serving as an isolation structure of the semiconductor structure may be used to isolate adjacent devices. In one embodiment, the isolation structure 401 may be made of silicon oxide. In certain embodiments, the isolation structure may be made of silicon nitride, or silicon oxynitride, etc.

In one embodiment, the gate structure 402 may be formed on each fin in the pull-up transistor region I and the pull-down transistor region II. For example, the gate structure 402 in the pull-up transistor region I may be across a length portion of the first fin 410, and cover portions of the top and sidewalls of the first fin 410. The gate structure 402 in the first pull-down transistor region 31 may be across a length portion of the second fin 420, and cover portions of the top and sidewalls of the second fin 420. The gate structure 402 in the second pull-down transistor region 32 may be across a length portion of the third fin 430, and cover portions of the top and sidewalls of the third fin 430.

The gate structure 402 may include a gate dielectric layer and a gate electrode layer on the gate dielectric layer. The gate dielectric layer may be made of silicon oxide, or a high-K gate dielectric material, etc. The gate electrode layer may be made of polysilicon or a metal material, including one or more of Ti, Ta, TiN, TaN, TiAl, TiAlN, Cu, Al, W, Ag, and Au.

In one embodiment, the pull-up transistor region I may include a PMOS region, thus the pull-up doped epitaxial layers 431 may be doped with P-type ions. The pull-up doped epitaxial layers 431 may be made of P-type doped silicon or SiGe, etc. In one embodiment, the P-type ions in the pull-up doped epitaxial layers 431 may include Ge ions. The pull-up doped epitaxial layers 431 may be made of SiGe.

The concentration of the Ge ions in the pull-up doped epitaxial layers 431 may be dependent on the process requirements. In one embodiment, the concentration of the Ge ions in the pull-up doped epitaxial layers 431 may be in a range of approximately $5.02 \times 10^{21}$ atoms/cm$^3$-$2.5 \times 10^{22}$ atoms/cm$^3$.

The volume of the pull-up doped epitaxial layers 431 may be large, such that the pull-up doped epitaxial layers 431 may effectively improve the carrier mobility of the pull-up transistor. The top surface areas of the pull-up doped epitaxial layers 431 may be large, such that the contact resistance between the metal silicide, formed on the pull-up doped epitaxial layers 431, and the pull-up doped epitaxial layers 431 may be small.

In one embodiment, the pull-down transistor region II may include the first pull-down transistor region 31 and the second pull-down transistor region 32 adjacent to each other. The first pull-down transistor region 31 may be adjacent to the pull-up transistor region I. Therefore, the first pull-down doped region 432 may be formed in the second fin 120 on one side of the gate structure 402 in the first pull-down transistor region 31. The second pull-down doped region (illustrated as region 'J' in FIG. 18 may be formed in the second fin 120 on the other side of the gate structure 402 in the first pull-down transistor region 31.

In one embodiment, the pull-down transistor region II may include an NMOS region, thus the first pull-down doped region 432 and the second pull-down doped region may be doped with N-type ions.

The first pull-down doped region 432 may be connected to the adjacent pull-up doped epitaxial layer 431. In one embodiment, only the second pull-down doped region may be the non-epitaxial layer doped region. In other words, the pull-down epitaxial layer may not be formed in the second fin 420 corresponding to the second pull-down doped region. Therefore, the bridging phenomenon between the second pull-down doped region and the adjacent pull-up doped epitaxial layer 431, caused by too small distance between the adjacent fins or too large volume of the epitaxial layers, can be avoided.

The doped ions in the second pull-down doped region may include P ions, or As ions, etc. Concentration of doped ions in the second pull-down doped region may be dependent on the process requirements. In one embodiment, the doped ions in the second pull-down doped region may be P ions, and a concentration of the P ions in the second pull-down doped region may be in a range of approximately $1\times10^{19}$ atoms/cm$^3$-$1\times10^{21}$ atoms/cm$^3$. Or, the doped ions in the second pull-down doped region may be As ions, and a concentration of the As ions in the second pull-down doped region may be in a range of approximately $1\times10^{21}$ atoms/cm$^3$-$1\times10^{22}$ atoms/cm$^3$.

In one embodiment, to ensure that the contact resistance between the first pull-down doped region 432 and the metal silicide formed on the first pull-down doped region 432 is small, the pull-down epitaxial layer (not illustrated) may be formed in the fin corresponding to the first pull-down doped region 432. The first pull-down doped region 432 may be formed in the pull-down epitaxial layer, and the pull-down epitaxial layer may be made of Si, or SiC, etc.

Correspondingly, the first pull-down doped region 432 may be made of N-type doped silicon, or SiC, etc. In one embodiment, the first pull-down doped region 432 may be made of SiP. The concentration of doped ions in the first pull-down doped region 432 may be dependent on the process requirements. In one embodiment, the concentration of the P ions in the first pull-down doped region 432 may be in a range of approximately $1\times10^{20}$ atoms/cm$^3$-$2\times10^{21}$ atoms/cm$^3$.

The volume of the first pull-down doped region 432 may be large, the top surface area of the first pull-down doped region 432 may be large Therefore, the contact resistance between the metal silicide formed on the first pull-down doped region 432 and the first pull-down doped region 432 may be small.

In one embodiment, the pull-down transistor region II may include the second pull-down transistor region 32. Therefore, the semiconductor structure may include third pull-down doped regions 433 in the third fin 430 on both sides of the gate structure 402 in the second pull-down transistor region 32. The third pull-down doped regions 433 may be made of the same material as the first pull-down doped region 431. Correspondingly, the third pull-down doped regions 433 may be made of SiP, and the concentration of the P ions in the third pull-down doped regions 433 may be in a range of approximately $1\times10^{20}$ atoms/cm$^3$-$2\times10^{21}$ atoms/cm$^3$.

In one embodiment, the semiconductor structure may include the second pull-down doped region. The second pull-down doped region may be formed in the fin on the other side of the gate structure in the pull-down transistor region, and the second pull-down doped region may be the non-epitaxial layer doped region. In other words, the pull-down epitaxial layer may not be formed in the fin on the other side of the gate structure in the pull-down transistor region. The pull-down transistor region may be adjacent to the pull-up transistor region. Therefore, compared to the method for forming the pull-down epitaxial layer in the fin on the other side of the gate structure in the pull-down transistor region, the method consistent with the described embodiments can avoid the occurrence of the bridging issue between the second pull-down doped region and the pull-up doped epitaxial layer caused by the too small distance between the fin in the pull-down transistor region and the fin in the pull-up transistor region.

Correspondingly, a static random access memory (SRAM) is also provided in the present disclosure. The SRAM may include a semiconductor structure described in the above embodiments. Details of the semiconductor structure may be referred to the corresponding descriptions of the semiconductor structure in the above-described embodiments, and are not repeated herein.

In the SRAM, the second pull-down doped region formed in the fin on the other side of the gate structure in the pull-down transistor region may be the non-epitaxial layer doped region. In other words, the pull-down epitaxial layer may not be formed in the fin on the other side of the gate structure in the pull-down transistor region. The pull-down transistor region may be adjacent to the pull-up transistor region. Therefore, compared to the method for forming the pull-down epitaxial layer in the fin on the other side of the gate structure in the pull-down transistor region, the method consistent with the described embodiments can avoid the occurrence of the bridging issue between the second pull-down doped region and the pull-up doped epitaxial layer caused by the too small distance between the fin in the pull-down transistor region and the fin in the pull-up transistor region.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for fabricating a semiconductor structure, comprising:
   providing a base substrate, including a substrate and a plurality of discrete fins on the substrate, wherein the substrate includes a pull-up transistor region and a pull-down transistor region adjacent to the pull-up transistor region;
   forming a gate structure, across a length portion of each fin, covering top and sidewall surfaces of each fin, and on each fin;
   forming pull-up doped epitaxial layers, in the fin on both sides of the gate structure in the pull-up transistor region;
   forming a first pull-down doped region and a second pull-down doped region, in the fin on two sides of the gate structure in the pull-down transistor region, respectively, wherein:
     the first pull-down doped region is an epitaxial region connected to the pull-up doped epitaxial layer; and
     the second pull-down doped region is a non-epitaxial region formed by performing an ion-doped non-epitaxial layer process on the fin.

2. The method according to claim 1, wherein:
   the pull-up transistor region includes a PMOS region;
   the pull-down transistor region includes an NMOS region;
   doped ions in the pull-up doped epitaxial layers include P-type ions; and
   doped ions in the first pull-down doped region and the second pull-down doped region include N-type ions.

3. The method according to claim 1, wherein a process for forming the pull-up doped epitaxial layers includes:
an in-situ doped selective epitaxial process, including:
forming pull-up epitaxial layers in the fin on both sides of the gate structure in the pull-up transistor region, and
in-situ self-doping P-type ions during the process for forming the pull-up epitaxial layers.

4. The method according to claim 3, wherein:
the pull-up doped epitaxial layers are made of silicon doped with Ge ions; and
a concentration of the Ge ions in the pull-up doped epitaxial layers is in a range of approximately $5.02 \times 10^{21}$ atoms/cm$^3$-$2.5 \times 10^{22}$ atoms/cm$^3$.

5. The method according to claim 1, wherein forming the second pull-down doped region includes:
performing an N-type ion implantation process on the fin on another side of the gate structure in the pull-down transistor region.

6. The method according to claim 5, wherein parameters of the N-type ion implantation process include:
implanted ions of P ions, having implantation ion energy in a range of approximately 1KeV -4 KeV, and an implantation ion dose in a range of approximately $1 \times 10^{15}$ atoms/cm$^3$-$2 \times 10^{15}$ atoms/cm$^3$; or
implanted ions of As ions, having implantation ion energy in a range of approximately 1 KeV -4 KeV, and an implantation ion dose in a range of approximately $1 \times 10^{15}$ atoms/cm$^3$-$4 \times 10^{15}$ atoms/cm$^3$.

7. The method according to claim 1, wherein a process for forming the first pull-down doped region includes:
an in-situ doped selective epitaxial process, including:
forming a pull-down epitaxial layer in the fin on one side of the gate structure in the pull-down transistor region, and
in-situ self-doping N-type ions when forming the pull-down epitaxial layer.

8. The method according to claim 7, wherein:
the first pull-down doped region is made of silicon doped with P ions; and
a concentration of the P ions in the first pull-down doped region is in a range of approximately $1 \times 10^{20}$ atoms/cm$^3$-$2 \times 10^{21}$ atoms/cm$^3$.

9. The method according to claim 1, wherein forming the pull-up doped epitaxial layers, the first pull-down doped region and the second pull-down doped region includes:
forming a P-region mask layer, on top and sidewalls of the fin in the pull-up transistor region, wherein the P-region mask layer is formed on top and sidewalls of the fin in the pull-down transistor region;
forming a P-region trench, in the fin on both sides of the gate structure in the pull-up transistor region, by etching the P-region mask layer on the top of the fin in the pull-up transistor region and etching portions of a thickness of the fin in the pull-up transistor region, wherein the etched fin in the pull-up transistor region is coplanar with a top of the P-region mask layer;
forming the pull-up doped epitaxial layers in the P-region trench;
forming an N-region mask sidewall spacer, on the P-region mask layer in the pull-down transistor region after forming the pull-up doped epitaxial layers, wherein the N-region mask sidewall spacer and the P-region mask layer in the pull-down transistor region serve as an N-region mask layer;
forming an N-region trench, in the fin on one side of the gate structure in the pull-down transistor region, by etching the N-region mask layer on top of the fin on one side of the gate structure in the pull-down transistor region and etching portions of a thickness of the fin on one side of the gate structure in the pull-down transistor region, wherein the etched fin in the pull-down transistor region is coplanar with a top of the N-region mask layer;
forming the first pull-down doped region, by forming a pull-down epitaxial layer in the N-region trench, and in-situ self-doping N-type ions during the process for forming the pull-down epitaxial layer;
forming a patterned layer, covering the pull-up transistor region and the first pull-down doped region, and exposing the N-region mask layer on the top of the fin on the other side of the gate structure in the pull-down transistor region; and
forming the second pull-down doped region, in the fin on the other side of the gate structure in the pull-down transistor region by performing an ion doping process on the N-region mask layer with the patterned layer as a mask.

10. The method according to claim 1, wherein:
the pull-down transistor region includes a first pull-down transistor region and a second pull-down transistor region adjacent to the first pull-down transistor region, and the first pull-down transistor region is adjacent to the pull-up transistor region;
the gate structure in the first pull-down transistor region is across a length portion of the fin in the first pull-down transistor region, and the gate structure in the second pull-down transistor region is across a length portion of the fin in the second pull-down transistor region;
the first pull-down doped region in the fin on one side of the gate structure in the first pull-down transistor region is formed by performing an in-situ doped selective epitaxial process;
the second pull-down doped region in the fin on the other side of the gate structure in the first pull-down transistor region is formed by performing the ion-doped non-epitaxial layer process; and
third pull-down doped regions in the fin on both sides of the gate structure in the second pull-down transistor region are formed when performing the in-situ doped selective epitaxial process, wherein the third pull-down doped regions are made of the same material as the first pull-down doped region.

11. A method for fabricating a semiconductor structure, comprising: providing a base substrate, including a substrate and a plurality of discrete fins on the substrate, wherein the substrate includes a pull-up transistor region and a pull-down transistor region adjacent to the pull-up transistor region;
performing a pull-down threshold adjustment implantation treatment on the base substrate corresponding to the second pull-down doped region;
forming a gate structure, across a length portion of each fin, covering top and sidewall surfaces of each fin, and on each fin;
forming pull-up doped epitaxial layers, in the fin on both sides of the gate structure in the pull-up transistor region;
forming a first pull-down doped region, in the fin on one side of the gate structure in the pull-down transistor region, wherein the first pull-down doped region is connected to an adjacent pull-up doped epitaxial layer; and
forming a second pull-down doped region, in the fin on another side of the gate structure in the pull-down transistor region, wherein the second pull-down doped region is formed by performing an ion-doped non-epitaxial layer process on the fin.

12. The method according to claim 11, wherein parameters of the pull-down threshold adjustment implantation treatment include:
doped ions including N-type ions;
implantation ion energy in a range of approximately 1 KeV -10 KeV; and
an implantation ion dose in a range of approximately $1 \times 10^{13}$ atoms/cm$^3$-$5 \times 10^{14}$ atoms/cm$^3$.

13. The method according to claim 11, wherein:
the pull-up transistor region includes a PMOS region;
the pull-down transistor region includes an NMOS region;
doped ions in the pull-up doped epitaxial layers include P-type ions; and
doped ions in the first pull-down doped region and the second pull-down doped region include N-type ions.

14. The method according to claim 11, wherein a process for forming the pull-up doped epitaxial layers includes:
an in-situ doped selective epitaxial process, including:
forming pull-up epitaxial layers in the fin on both sides of the gate structure in the pull-up transistor region, and
in-situ self-doping P-type ions during the process for forming the pull-up epitaxial layers.

15. The method according to claim 14, wherein:
the pull-up doped epitaxial layers are made of silicon doped with Ge ions; and
a concentration of the Ge ions in the pull-up doped epitaxial layers is in a range of approximately $5.02 \times 10^{21}$ atoms/cm$^3$-$2.5 \times 10^{22}$ atoms/cm$^3$.

16. The method according to claim 11, wherein forming the second pull-down doped region includes:
performing an N-type ion implantation process on the fin on another side of the gate structure in the pull-down transistor region.

17. The method according to claim 16, wherein parameters of the N-type ion implantation process include:
implanted ions of P ions, having implantation ion energy in a range of approximately 1 KeV -4 KeV, and an implantation ion dose in a range of approximately $1 \times 10^{15}$ atoms/cm$^3$-$2 \times 10^{15}$ atoms/cm$^3$; or
implanted ions of As ions, having implantation ion energy in a range of approximately 1 KeV -4 KeV, and an implantation ion dose in a range of approximately $1 \times 10^{15}$ atoms/cm$^3$ -$4 \times 10^{15}$ atoms/cm$^3$.

18. The method according to claim 11, wherein a process for forming the first pull-down doped region includes:
an in-situ doped selective epitaxial process, including:
forming a pull-down epitaxial layer in the fin on one side of the gate structure in the pull-down transistor region, and
in-situ self-doping N-type ions when forming the pull-down epitaxial layer.

19. The method according to claim 18, wherein:
the first pull-down doped region is made of silicon doped with P ions; and
a concentration of the P ions in the first pull-down doped region is in a range of approximately $1 \times 10^{20}$ atoms/cm$^3$-$2 \times 10^{21}$ atoms/cm$^3$.

* * * * *